United States Patent [19]

Saito et al.

[11] Patent Number: 5,561,174

[45] Date of Patent: Oct. 1, 1996

[54] LIQUID EPOXY RESIN COMPOSITION

[75] Inventors: Yoshinori Saito; Masaaki Hirayama, both of Nagaokakyo; Shunjiro Imagawa, deceased, late of Nagaokakyo, all of Japan, by Reiko Imagawa, Kazuyuki Imagawa, Yoko Imagawa, legal representatives

[73] Assignee: Murata Manufacturing Co., Ltd., Japan

[21] Appl. No.: 536,969

[22] Filed: Sep. 29, 1995

[30] Foreign Application Priority Data

Sep. 30, 1994 [JP] Japan .................................. 6-236194

[51] Int. Cl.$^6$ .................... C08F 283/00; C08G 77/00; C08L 83/00
[52] U.S. Cl. .................... 523/403; 523/414; 523/421; 523/425; 523/428; 523/461; 525/524; 525/476; 525/477; 528/12; 528/20; 528/22; 528/25; 528/33; 528/38; 528/41; 528/43
[58] Field of Search ..................... 523/403, 414, 523/421, 425, 428, 461; 525/524, 476, 477; 528/12, 20, 22, 25, 33, 38, 41, 43

[56] References Cited

U.S. PATENT DOCUMENTS

| | | | |
|---|---|---|---|
| 3,843,577 | 10/1974 | Keil | 525/476 |
| 3,926,885 | 12/1975 | Keil | 525/476 |
| 4,624,998 | 11/1986 | Keil | 525/476 |
| 4,707,529 | 11/1987 | Hoffman et al. | 525/476 |
| 4,859,722 | 8/1989 | Shiobara et al. | 525/476 |
| 4,877,822 | 10/1989 | Itoh et al. | 525/476 |
| 5,043,211 | 8/1991 | Yoshizumi et al. | 525/476 |
| 5,102,960 | 4/1992 | Imai et al. | 525/476 |
| 5,173,544 | 12/1992 | Shimizu et al. | 525/476 |
| 5,279,860 | 1/1994 | Griswold et al. | 525/476 |
| 5,364,923 | 11/1994 | Mikami | 525/102 |

FOREIGN PATENT DOCUMENTS

| | | |
|---|---|---|
| 01-81848 | 2/1989 | Japan . |
| 01-268721 | 10/1989 | Japan . |

*Primary Examiner*—John C. Bleutoe
*Assistant Examiner*—Randy Gulakowski
*Attorney, Agent, or Firm*—Ostrolenk, Faber, Gerb & Soffen, LLP

[57] ABSTRACT

Disclosed is a liquid epoxy resin composition comprising (A) a liquid epoxy resin, (B) a dimethylpolysiloxane having epoxy groups at its both ends, and (C) a dispersing agent comprising the reaction product of (C-1) a dimethylpolysiloxane having amino groups or carboxyl groups reactive with epoxy resins at its side chains or both ends and having phenyl groups or polyether groups for improving its compatibility with epoxy resins at its side chains, and (C-2) an epoxy resin having the same structure as the component (A). The composition has a reduced internal stress, while maintaining the heat resistance intrinsic to epoxy resins, and has excellent resistance, crack resistance and heat shock resistance.

15 Claims, 1 Drawing Sheet

LIQUID EPOXY RESIN COMPOSITION

FIELD OF THE INVENTION

The present invention relates to a liquid epoxy resin composition which is used as a resin sealant or adhesive for high-voltage electronic parts.

BACKGROUND OF THE INVENTION

It is desirable that epoxy resins which are intended to be used as a resin sea or adhesive in a high-voltage electronic part have reduced internal stress while maintaining their intrinsic heat resistance. In order to reduce the internal stress of epoxy resins while maintaining the heat resistance, various methods for dispersing a silicone oil or silicone rubber in an epoxy resin to thereby make a dispersion which has a sea-island structure have heretofore been proposed.

Many of the known s are directed to the use of a solid epoxy resin composition as sealants for semiconductors. However, no example is known which is directed to the use of liquid epoxy resins. Silicone easily separates from liquid resins before and during curing because of its properties and reactivity, with the result that the silicone oil often bleeds out of the surface of the resin or is en completely separated from the resin to form a distinct layer on its surface. In order to solve these problems, it has heretofore been proposed to employ one or both of the following measures:

(1) Addition of a dispersing agent which is compatible with epoxy resins and silicone compounds.

(2) Curing of silicone compounds that form the islands.

For example, Japanese Pal Lent Laid-Open Nos. 3-167250 and 1-268717 disclose the combination of the above-mentioned measures (1) and (2), and Japanese Patent Laid-Open No. 62-158716 discloses the above-mentioned measure (1).

However, even employing the above-mentioned measure(s) (1) and/or (2), there still remain problems to be solved. In more concrete terms even when employing measure (1), some dispersing agent: themselves have low reactivity with epoxy resins. In such cases, the dispersing agent which is added bleeds out during the curing of the epoxy resin. On the other hand, the curing of a silicone compound that form islands according to the measure (2) results in an increase in the viscosity of the epoxy resin composition which increases the difficulty in handling the composition.

In addition, it is necessary to heat the whole epoxy resin composition during the reaction of the silicone compound therein, and therefore an increase in the cost of the resin is inevitable due to the necessary heating.

SUMMARY OF THE INVENTION

Accordingly, the object of the present invention is to provide a liquid epoxy resin composition which satisfies all the heat resistance, crack resistance and heat shock resistance requirements of the composition, by causing it to have a reduced internal stress while at the same time maintaining the heat resistance intrinsic to epoxy resins.

Specifically, the present invention provides a liquid epoxy resin composition comprising the following components (A) to (C):

(A) a liquid epoxy resin, (B) a dimethylpolysiloxane having epoxy groups at its both ends, and (C) a dispersing agent composition comprising the reaction product of the following components (C-1) and (C-2):

(C-1) a dimethylpolysiloxane having amino groups or carboxyl groups reactive with epoxy resins on its side chains or both ends and having phenyl groups or polyether groups for improving its compatibility with epoxy resins on its side chains, and (C-2) an epoxy resin having the same structure as the component (A).

Other features and ages of the present invention will become apparent the following description of the invention which refers to the accompanying drawings.

DETAILED DESCRIPTION OF EMBODIMENT OF THE INVENTION

Figure 1A:
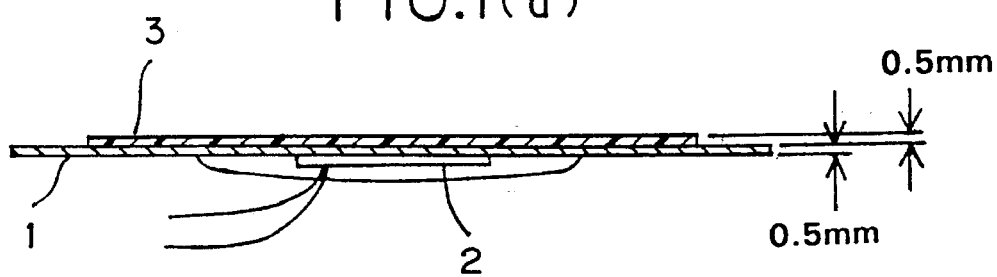
FIG. 1(a) shows a sectional view of a sample of the present invention which has bee prepared in the examples and the comparative examples mentioned hereunder for evaluating properties.

The epoxy resins which can be used for component (A) and component (C-2) include ester-type epoxy resins, ether-type epoxy resins, etc. Examples of the ether-type epoxy resins are bisphenol-A-type epoxy resins and bisphenol-F-type epoxy resins.

The liquid epoxy resin composition of the present invention may optionally contain conventional epoxy resin curing agents, inorganic fillers, flame retardants and/or other additives.

Preferably, the amount of the component (B) and that of the component (C-1) in the composition are from 5 to 60 parts by weight relative to 100 parts by weight of the sum of the component (A) and t he component (C-2), namely from 5 to 60 pph (parts per hundred), and from 1 to 15 parts by weight relative to the same, namely from 1 to 15 pph, respectively.

The reason why the amount of the component (B) in the composition is from 5 to 60 pph is that when it is more than 60 pph, the sea parts d the island parts of epoxy resin and silicone dispersion are reversed so that the composition cannot be cured, and if it is less than 5 pph, the composition cannot be formed into a cured product with reduced stress.

The amount of the component (C) in the composition depends on the amount of the component (C-1) to be used for forming it and is preferably from 1 to 15 pph relative to the epoxy resin content in the composition. If the amount falls within the defined range, the component (C) exhibits a good effect as a dispersing agent. If, however, is less than 1 pph, the dispersing effect of the component (C) is insufficient, and if it is more than 15 pph, the component (C) consumes too many silicone bonds in its molecule thereby resulting in lowering of the glass transition point of the cured product from the composition.

Also preferably, the functional equivalent of the component (C-1) reactive with epoxy resins is from 500 to 5000. This is because if it is more than the defined range, the compatibility of the component (C) with epoxy resins is lowered and the function thereof as a dispersing agent is lowered, but if it is less than the defined range, the compatibility of the component (C) with silicone resins is lowered and the function thereof as a dispersing agent is also lowered.

The structure of the dimethylpolysiloxane having epoxy groups at its both ends, component (B), is not critical, provided that it has the epoxy functional groups. However, if its epoxy equivalent is too small, component (B) is dispersed in epoxy resins to thereby lower the glass transition point of the cured product obtained from the composition, and if it is too large, the viscosity of the composition increases due to the increase in the molecular weight of the component (B). Preferably, therefore, the component (B) has an epoxy equivalent of from 500 to 5000.

Examples 1 to 10 of the present invention are shown in Table 1 while Referential Examples 1 to 3 and Comparative Examples 1 and 2 are shown in Table 2 below.

TABLE 1

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Bisphenol-A-type Epoxy Resin (epoxy equivalent: 190) | 90 | 90 | 90 | 90 | 90 | 99 | 85 | 90 | 90 | 90 |
| Dimethylpolysiloxane (1) with epoxy groups at its both ends (epoxy equivalent: 500) | 15 | — | — | — | — | — | — | — | — | — |
| Dimethylpolysiloxane (2) with epoxy groups at its both ends (epoxy equivalent: 1,000) | — | 15 | — | 5 | 60 | 15 | 15 | 15 | 15 | 15 |
| Dimethylpolysiloxane (3) with epoxy groups at its both ends (epoxy equivalent: 5,000) | — | — | 15 | — | — | — | — | — | — | — |
| Dispersing Agent Composition (1) | 20 (10/10) | 20 (10/10) | 20 (10/10) | 20 (10/10) | 20 (10/10) | 2 (1/1) | 30 (15/15) | — | — | — |
| Dispersing Agent Composition (2) | — | — | — | — | — | — | — | 20 (10/10) | — | — |
| Dispersing Agent Composition (3) | — | — | — | — | — | — | — | — | 20 (10/10) | — |
| Dispersing Agent Composition (4) | — | — | — | — | — | — | — | — | — | 20 (10/10) |
| Silicone Rubber Powder | — | — | — | — | — | — | — | — | — | — |
| Curing Agent, Methyltetrahydrophthalic Anhydride | 80 | 80 | 80 | 80 | 80 | 80 | 80 | 80 | 80 | 80 |
| Curing Promoter (dimethylbenzylamine) | 1.0 | 1.0 | 1.0 | 1.0 | 1.0 | 1.0 | 1.0 | 1.0 | 1.0 | 1.0 |
| Viscosity (25° C.) (unit: cps) | 1,500 | 1,600 | 1,700 | 1,800 | 1,100 | 1,400 | 1,600 | 1,500 | 1,600 | 1,500 |
| Glass Transition Point (unit: °C.) | 114 | 115 | 117 | 115 | 116 | 118 | 112 | 112 | 117 | 113 |
| Resin Internal Stress (50° C.) (unit: MPa) | 8.8 | 8.6 | 8.7 | 10.3 | 5.5 | 8.5 | 8.6 | 8.8 | 8.0 | 8.3 |

TABLE 2

|  | Referential Example 1 | Referential Example 2 | Referential Example 3 | Comparative Example 1 | Comparative Example 2 |
|---|---|---|---|---|---|
| Bisphenol-A-type Epoxy Resin (epoxy equivalent: 190) | 80 | 90 | 90 | 100 | 100 |
| Dimethylpolysiloxane (1) with epoxy groups at its both ends (epoxy equivalent: 500) | — | — | — | — | — |
| Dimethylpolysiloxane (2) with epoxy groups at its both ends (epoxy equivalent: 1,000) | 15 | 4 | 64 | — | — |
| Dimethylpolysiloxane (3) with epoxy groups at its both ends (epoxy equivalent: 5,000) | — | — | — | — | — |
| Dispersing Agent Composition (1) | 40 (20/20) | 20 (10/10) | 20 (10/10) | — | — |
| Dispersing Agent Composition (2) | — | — | — | — | — |
| Dispersing Agent Composition (3) | — | — | — | — | — |
| Dispersing Agent Composition (4) | — | — | — | — | — |
| Silicone Rubber Powder | — | — | — | — | 15 |
| Curing Agent, Methyltetrahydrophthalic Anhydride | 80 | 80 | 80 | 80 | 80 |
| Curing Promoter (dimethylbenzylamine) | 1.0 | 1.0 | 1.0 | 1.0 | 1.0 |
| Viscosity (25° C.) (unit: cps) | 1,700 | 1,800 | 1,300 | 2,500 | 8,200 |

TABLE 2-continued

|  | Referential Example 1 | Referential Example 2 | Referential Example 3 | Comparative Example 1 | Comparative Example 2 |
|---|---|---|---|---|---|
| Glass Transition Point (unit: °C.) | 102 | 116 | Not cured. | 125 | 123 |
| Resin Internal Stress (50° C.) (unit: MPa) | 8.6 | 12.0 | Not cured. | 12.5 | 8.5 |

In Tables 1 and 2 above, the dispersing agent compositions (1) to (4) were formed, using the following dimethylpolysiloxane (amino equivalent: from 1000 to 5000):

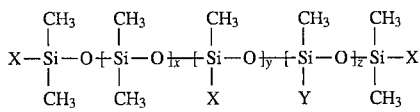

in which

X is —R—NH$_2$ or —CH$_3$ and Y is

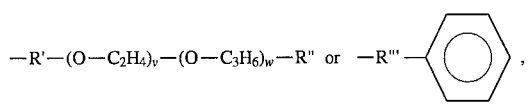

where R, R', R"
and R'" are substituted or unsubstituted hydrocarbon groups and v, w, x, y and z are each integers greater than one.

Dispersing Agent Composition (1)

Dimethylpolysiloxane having amino groups at its both ends and phenyl groups in its side chains (amino equivalent: 2000) was mixed with a bisphenol-A-type epoxy resin (epoxy equivalent: 190) at a ratio of 1:1 by weight under heating at 120° C. for 6 hours to obtain dispensing agent composition (1).

Dispersing Agent Composition (2)

Dimethylpolysiloxane having amino groups at its both ends and phenyl groups in its side chains (amino equivalent: 500) was mixed with bisphenol-A-type epoxy resin (epoxy equivalent: 190) at a ratio of 1:1 by weight under heating at 120° C. for 6 hours to obtain dispensing agent composition (2).

Dispersing Agent Composition (3)

Dimethylpolysiloxane having amino groups at its both ends and phenyl groups in its side chains (amino equivalent: 5000) was mixed with a bisphenol-A-type epoxy resin (epoxy equivalent: 190) at a ratio 1:1 by weight under heating at 120° C. for 6 hours to obtain dispersing agent composition (3).

Dispersing Agent Composition (4)

Dimethylpolysiloxane having amino groups and polyether groups in its side chains (amino equivalent: 1000) was mixed with a bisphenol-A-type epoxy resin (epoxy equivalent: 190) at a ratio of 1:1 by weight under heating at 120° C. for 6 hours to obtain dispersing agent composition (4).

In Tables 1 and 2, the numerals indicating the contents of the components constituting the epoxy resin composition are all by weight. The numerals in parenthesizes in the columns of the dispersing agent composition indicate the weight of dimethylpolysiloxane/epoxy resin in each composition.

In Table 2, the results of Referential Examples 1 to 3 are the basis of the preferred ranges. In Referential Example 1, dimethylpolysiloxane (component (C-1)) in the dispersing agent composition is 20 parts by weight, which is greater than the range of from 1 to 15 parts by weight. In Referential Example 2, dimethylpolysiloxane with epoxy groups at its both ends (component (B)) is 4 parts by weight, which is less than the range of from 5 to 60 parts. In Referential Example 3, dimethylpolysiloxane with epoxy groups at its both ends (component (B)) is 65 parts by weight, which is greater than the range of from 5 to 60 parts by weight.

In Comparative Example 1, a non-modified epoxy resin was used. In Comparative Example 2, a silicone rubber particles-dispersed epoxy resin was used.

Figure 1B:
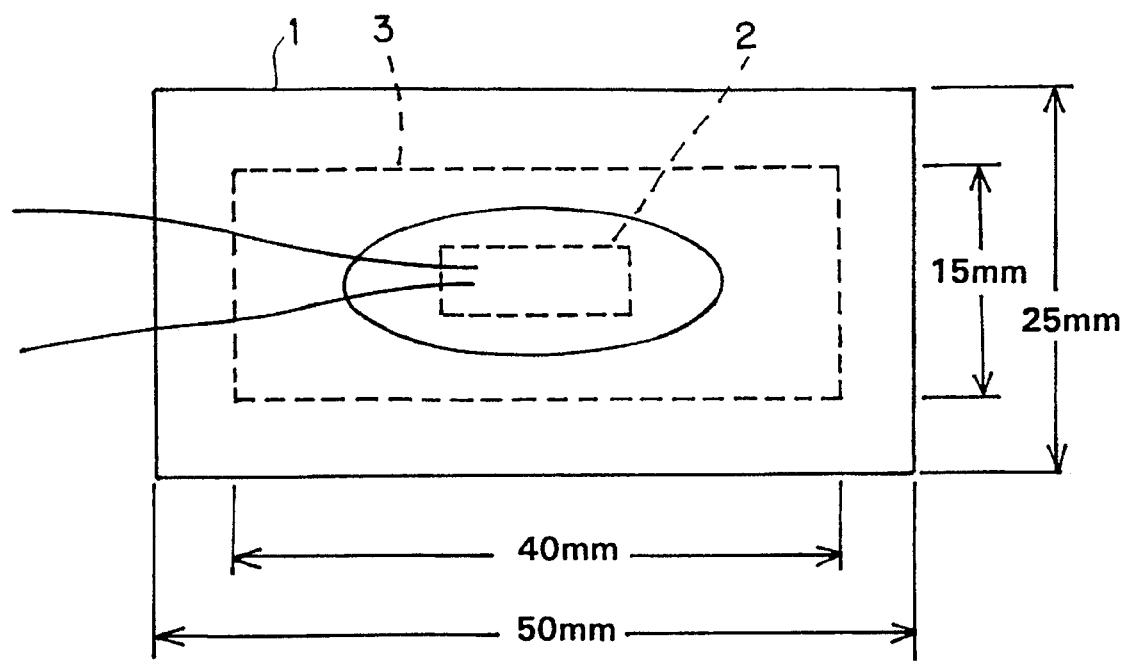
FIG. 1(b) is a bottom vie of the sample.

"Resin internal stress" in Tables 1 and 2 was measured, using the sample shown by FIG. 1(a) and FIG. 1(b). FIG. 1(a) is a sectional view of the sample, and FIG. 1(b) is a bottom view thereof. Referring to FIG. 1(a) and FIG. 1(b), a strain gauge 2 is attached to the center of one surface of a metal plate 1, while a resin 3, which the internal stress is measured, is mounted on the center of the other surface thereof. FIGS. 1(a) and 1(b) show the dimensions of these parts.

As is noted from Table 1, the epoxy resin composition obtained in Examples and 10 each had a reduced internal stress, while their viscosities were not increased and their glass transition points were not greatly lowered. As is noted from Table 2, however the internal stress of the composition obtained in Comparative Example 1 was large, and the viscosity of the composition obtained in Comparative Example 2 was large though its internal stress was reduced.

The composition obtained in Referential Example 1 has a low glass transition point and therefore has poor heat resistance and bad electrical characteristics. The internal stress of the composition obtained in Referential Example 2 is not reduced significantly, as is known when compared with that of the composition obtained in Comparative Example 1. In the composition of Referential Example 3, the sea parts and the island parts of the epoxy resin and the silicone were reversed. Therefore, the composition did not cure.

According to the present invention described hereinabove, obtained is a liquid epoxy resin composition in which the silicone compound is neither separated nor bleeds out during curing the composition, even though the silicone compound is not previously cured. The internal stress of the epoxy resin composition is lowered, while the glass transition point of the epoxy resin matrix is not lowered. The internal stress of the epoxy resin composition varies, depending on the amount of the dimethylpolysiloxane with epoxy groups at its both ends therein. It has been confirmed that the internal stress of the composition of the most preferred example of the present invention is about ½ of that of the comparative composition containing a non-modified epoxy resin. Since the silicone compound and the epoxy resin constituting the composition of the present invention are cured at the same time, it is possible to lower the viscosity of the composition before curing the epoxy resin. In this connection, since the viscosity of the dimethylpolysiloxane with epoxy groups at its both ends is lower than that of an epoxy resin, the viscosity of the composition comprising the dimethylpolysiloxane is lower than that of the comparative composition containing a non-modified epoxy resin.

In addition, since only the dispersing agent moiety in the composition of the present invention is pre-reacted, the increase in the cost of the composition caused by any excess reactions is retarded.

While the invention has been described in detail and with reference to specific embodiments thereof, many other variations and modifications and other uses will be apparent to one skilled in the art and various changes and modifications can be made therein without departing from the spirit and scope thereof.

What is claimed is:

1. A liquid epoxy resin composition comprising
   (A) a liquid epoxy resin,
   (B) a dimethylpolysiloxane having epoxy groups at its both ends, and
   (C) a dispersing agent comprising the reaction product of the following components (C-1) and (C-2):
      (C-1) a dimethylpolysiloxane having amino groups or carboxyl groups reactive with epoxy resins at its side chains or both ends and having phenyl groups or polyether groups for improving its compatibility with epoxy resins at its side chains, and
      (C-2) an epoxy resin, having the same structure as the component (A).

2. The liquid epoxy resin composition as claimed in claim 1, wherein the content of the component (B) is from 5 to 60 parts by weight and that of the component (C-1) is from 1 to 15 parts by weight, each relative to 100 parts by weight of the sum of the component (A) and the component (C-2).

3. The liquid epoxy resin composition as claimed in claim 2, wherein the functional equivalent of component (C-1) reactive with epoxy resins is from 500 to 5000.

4. The liquid epoxy resin composition as claimed in claim 3, wherein the epoxy equivalent of the component (B) is from 500 to 5000.

5. The liquid epoxy resin composition as claimed in claim 1, wherein the functional equivalent of component (C-1) reactive with epoxy resins is from 500 to 5000.

6. The liquid epoxy resin composition as claimed in claim 5, wherein the epoxy equivalent of the component (B) is from 500 to 5000.

7. The liquid epoxy resin composition as claimed in claim 1, wherein the epoxy equivalent of the component (B) is from 500 to 5000.

8. The cured composition of claim 1.

9. The cured composition of claim 2.

10. The cured composition of claim 3.

11. The cured composition of claim 6.

12. In a high-voltage electronic part containing an epoxy resin sealant or adhesive therein, utilizing the cured composition of claim 8 as said sealant or adhesive.

13. In a high-voltage electronic part containing an epoxy resin sealant or adhesive therein, utilizing the cured composition of claim 9 as said sealant or adhesive.

14. In a high-voltage electronic part containing an epoxy resin sealant or adhesive therein, utilizing the cured composition of claim 10 as said sealant or adhesive.

15. In a high voltage electronic part containing an epoxy resin sealant or adhesive therein, utilizing the cured composition of claim 11 as said sealant or adhesive.

* * * * *